(12) United States Patent
Umeda et al.

(10) Patent No.: US 7,276,836 B2
(45) Date of Patent: Oct. 2, 2007

(54) PIEZOELECTRIC THIN-FILM RESONATOR AND PROCESS FOR PRODUCING SAME

(75) Inventors: Keiichi Umeda, Omihachiman (JP); Osamu Nakagawara, Ritto (JP)

(73) Assignee: Murata Manufacturing Co., Ltd. (JP)

( * ) Notice: Subject to any disclaimer, the term of this patent is extended or adjusted under 35 U.S.C. 154(b) by 49 days.

(21) Appl. No.: 11/295,444

(22) Filed: Dec. 7, 2005

(65) Prior Publication Data
US 2006/0119230 A1 Jun. 8, 2006

(30) Foreign Application Priority Data
Dec. 7, 2004 (JP) ............................. 2004-354733

(51) Int. Cl.
*H01L 41/047* (2006.01)
*H01L 41/083* (2006.01)
*H03H 9/24* (2006.01)

(52) U.S. Cl. .................... 310/320; 310/363; 310/364; 333/187; 29/25.35; 216/41

(58) Field of Classification Search ................ 310/320, 310/363–366; 333/186–187; 29/25.35; 216/41
See application file for complete search history.

(56) References Cited

U.S. PATENT DOCUMENTS 3,891,873 A * 6/1975 Yanagisawa et al. ....... 310/364
5,821,833 A * 10/1998 Lakin .......................... 333/187
6,975,182 B2 * 12/2005 Loebl et al. ................. 333/187
6,995,497 B2 * 2/2006 Inoue ........................... 310/320
7,071,795 B2 * 7/2006 Inoue ........................... 333/187
7,173,361 B2 * 2/2007 Saito et al. .................. 310/320

FOREIGN PATENT DOCUMENTS

| JP | 2002-278558 | 9/2002 |
|----|-------------|--------|
| JP | 2003-258594 | 9/2003 |

* cited by examiner

*Primary Examiner*—Thomas M. Dougherty
(74) *Attorney, Agent, or Firm*—Dickstein, Shapiro, LLP.

(57) ABSTRACT

A piezoelectric thin-film resonator includes a first excitation electrode and a second excitation electrode, the first excitation electrode being disposed opposite the second excitation electrode; a piezoelectric thin film disposed between the first excitation electrode and the second excitation electrode; and a substrate supporting the first excitation electrode, the substrate being composed of a $LiTaO_3$ single crystal or a $LiNbO_3$ single crystal, the first excitation electrode including an acoustic reflecting layer, the acoustic reflecting layer containing (a) at least one epitaxially grown first sublayer being composed of a conducting material and having a relatively high acoustic impedance; and (b) at least one epitaxially grown second sublayer being composed of another conducting material and having a relatively low acoustic impedance.

10 Claims, 5 Drawing Sheets

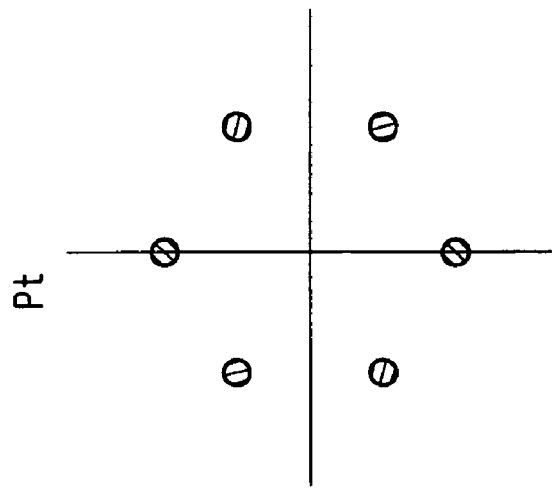
FIG. 4A-3
FIG. 4A-2
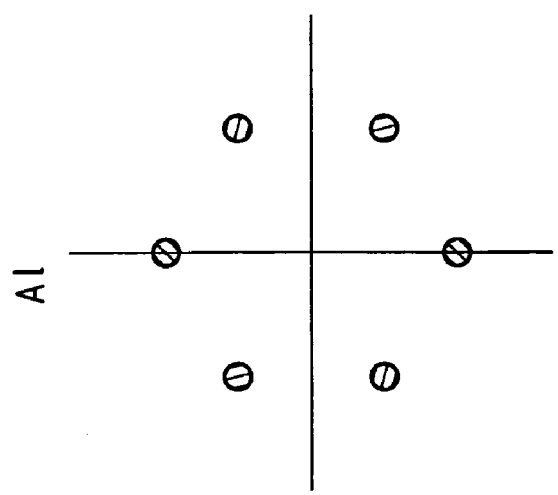
FIG. 4A-1
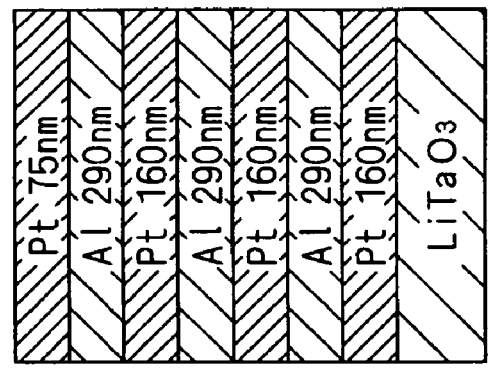

PIEZOELECTRIC THIN-FILM RESONATOR AND PROCESS FOR PRODUCING SAME

BACKGROUND OF THE INVENTION

1. Field of the Invention

The present invention relates to a piezoelectric thin-film resonator and a process for producing the same. In particular, the present invention relates to a piezoelectric thin-film resonator including an acoustic reflecting layer acoustically separating a thin-film portion containing a piezoelectric thin film sandwiched between a pair of electrodes from a substrate, and a process for producing the same.

2. Description of the Related Art

An example of a piezoelectric thin-film resonator using a bulk acoustic wave (BAW) in a piezoelectric thin film is a piezoelectric thin-film resonator using an acoustic reflecting layer acoustically separating a thin-film portion containing a piezoelectric thin film sandwiched between a pair of electrodes from a substrate.

With respect to such a piezoelectric thin-film resonator, for example, Japanese Unexamined Patent Application Publication No. 2002-278558 proposes a structure in which a conductive acoustic reflecting layer doubles as an electrode. The conductive acoustic reflecting layer includes a first conductive sublayer and a second conductive sublayer, the first and second conductive sublayers being alternately laminated and having different acoustic impedances. The conductive acoustic reflecting layer reflects an acoustic wave traveling toward a substrate to return the reflected wave to a thin film side.

Japanese Unexamined Patent Application Publication No. 2003-258594 discloses that, with respect to a surface acoustic wave (SAW) device using a surface acoustic wave on a piezoelectric thin film, providing an epitaxial Al film having a twin-crystal structure on a piezoelectric substrate composed of a $LiNbO_3$ or $LiTaO_3$ single crystal enables the improvement of power durability.

SUMMARY OF THE INVENTION

In the piezoelectric thin-film resonator disclosed in Japanese Unexamined Patent Application Publication No. 2002-278558, when a conductive acoustic reflecting layer is formed on a silicon substrate, which is commonly used, the resulting acoustic reflecting layer is a uniaxially oriented film including many grain boundaries. The grain boundaries scatter an acoustic wave. Therefore, loss of energy of the acoustic wave occurs in the acoustic reflecting layer, thus disadvantageously degrading the Q-value of the piezoelectric thin-film resonator.

In view of this, it is an object of the present invention to provide a piezoelectric thin-film resonator capable of reducing loss of energy in an acoustic reflecting layer to improve Q of the piezoelectric thin-film resonator, and to provide a process for producing the piezoelectric thin-film resonator.

To overcome the above-described problems, the present invention provides a piezoelectric thin-film resonator having a structure described below.

A piezoelectric thin-film resonator includes a first excitation electrode and a second excitation electrode, the first excitation electrode being disposed opposite the second excitation electrode; a piezoelectric thin film disposed between the first excitation electrode and the second excitation electrode; and a substrate supporting the first excitation electrode, the substrate being composed of a $LiTaO_3$ single crystal or a $LiNbO_3$ single crystal, the first excitation electrode including an acoustic reflecting layer, the acoustic reflecting layer containing (a) at least one epitaxially grown first sublayer being composed of a conducting material and having a relatively high acoustic impedance; and (b) at least one epitaxially grown second sublayer being composed of another conducting material and having a relatively low acoustic impedance.

In the above-described structure, by using a $LiTaO_3$ or $LiNbO_3$ single-crystal substrate, it is possible to easily form epitaxial films functioning as the first sublayer and the second sublayer on the substrate. The epitaxial films comprising the acoustic reflecting layer improve the surface roughness of the excitation electrode containing the acoustic reflecting layer and thus improve the degree of orientation of the piezoelectric thin film provided on the excitation electrode. Furthermore, the crystal orientation of the acoustic reflecting layer is oriented in a predetermined direction, thereby reducing loss of energy in the acoustic reflecting layer to improve the Q-value of the piezoelectric thin-film resonator.

Each of the at least one first sublayer and the at least one second sublayer in the acoustic reflecting layer is preferably an epitaxial sublayer having a twin-crystal structure.

In this case, the epitaxial acoustic reflecting layer having a twin-crystal structure is easily formed on the $LiTaO_3$ or $LiNbO_3$ single-crystal substrate.

Each of the at least one first sublayer and the at least one second sublayer in the acoustic reflecting layer is preferably composed of a metal having a face-centered cubic structure or an alloy principally containing a metal having a face-centered cubic structure.

In this case, the use of the metal having a face-centered cubic structure or the alloy principally containing the metal having a face-centered cubic structure allows easy production of the epitaxial films, functioning as the first sublayer and the second sublayer in the acoustic reflecting layer, having a twin-crystal structure.

Preferably, the at least one first sublayer in the acoustic reflecting layer is composed of (a) an elemental metal selected from Pt, Ir, Pd, Rh, Au, Ni, and Cu, or (b) an alloy principally containing at least one metal selected from Pt, Ir, Pd, Rh, Au, Ni, and Cu; and the second at least one sublayer in the acoustic reflecting layer is composed of (a) an elemental metal selected from Al and Ag; or (b) an alloy principally containing at least one metal selected from Al and Ag.

Preferably, the at least one first sublayer is composed of (a) elemental Pt; or (b) a Pt alloy, and the at least one second sublayer in the acoustic reflecting layer is composed of (a) elemental Al; or (b) an Al alloy, the acoustic reflecting layer including at least one intermediate sublayer being composed of titanium, the intermediate sublayer being disposed between each of the at least one first sublayer and the at least one second sublayer, each first sublayer being adjacent to a corresponding second sublayer.

In this case, the use of the intermediate sublayer composed of titanium achieves an easy production of the acoustic reflecting layer.

The piezoelectric thin film is preferably an epitaxial film.

In this case, the epitaxial piezoelectric thin film has improved piezoelectric characteristics compared with those of a uniaxially oriented piezoelectric thin film.

The substrate is preferably composed of (a) a Z-cut $LiTaO_3$ single crystal; or (b) a Z-cut $LiNbO_3$ single crystal.

In this case, the epitaxial films comprising the acoustic reflecting layer are easily grown on the substrate composed of the Z-cut LiTaO$_3$ single crystal or the Z-cut LiNbO$_3$ single crystal.

The piezoelectric thin film is preferably composed of ZnO or AlN.

In this case, the resulting piezoelectric thin-film resonator has satisfactory resonator characteristics.

Furthermore, the present invention provides a process for producing a piezoelectric thin-film resonator described below.

A process for producing a piezoelectric thin-film resonator includes a first step of forming a first excitation electrode on a substrate, the substrate being composed of a LiTaO$_3$ single crystal or a LiNbO$_3$ single crystal; a second step of forming a piezoelectric thin film on the first excitation electrode; and a third step of forming a second excitation electrode on the piezoelectric thin film. The first step further includes an acoustic reflecting layer forming-substep of forming an acoustic reflecting layer by alternately forming (a) at least one first sublayer being composed of a conducting material and having a relatively high acoustic impedance; and (b) at least one second sublayer being composed of another conducting material and having a relatively low acoustic impedance, the at least one first sublayer and the at least one second sublayer being formed on the substrate by epitaxially growth, and each of the at least one first sublayer and the at least one second sublayer functioning as at least part of the first excitation electrode.

According to the process described above, the acoustic reflecting layer is formed of epitaxial films, thereby improving the surface roughness of the excitation electrode including the acoustic reflecting layer to improve the degree of orientation of the piezoelectric thin film formed on the excitation electrode. Furthermore, the crystal orientation of the acoustic reflecting layer is oriented in a predetermined direction, thereby reducing loss of energy in the acoustic reflecting layer to improve the Q-value of the piezoelectric thin-film resonator.

Preferably, the acoustic reflecting layer-forming substep further includes the subsubsteps of (a) forming a resist pattern on the substrate by photolithography; (b) alternately depositing the at least one first sublayer and the at least one second sublayer by evaporation; and (c) removing the at least one first sublayer and the at least one second sublayer on the resist pattern together with the resist pattern.

In this case, it is possible to produce the piezoelectric thin-film resonator at low cost compared with a method for patterning the acoustic reflecting layer by dry etching.

Other features, elements, characteristics and advantages of the present invention will become more apparent from the following detailed description of preferred embodiments of the present invention (with reference to the attached drawings).

BRIEF DESCRIPTION OF THE DRAWINGS

FIGS. 3A-1 to 3A-3 are X-ray diffraction poles of an acoustic reflecting layer according to a comparative embodiment and FIGS. 3B-1 to 3B-3 are X-ray diffraction poles of an acoustic reflecting layer according to the first embodiment;

FIGS. 4A-1 to 4A-3 are X-ray diffraction poles of an acoustic reflecting layer according to the first embodiment of the present invention; and FIGS. 5A-1 to 5A-2 are X-ray diffraction poles of a piezoelectric thin film according to the comparative embodiment and FIGS. 5B-1 to 5B-2 are X-ray diffraction poles of a piezoelectric thin film according to the first embodiment.

DESCRIPTION OF THE PREFERRED EMBODIMENTS

Embodiments of the present invention will be described below with reference to FIGS. 1 to 5.

A piezoelectric thin-film resonator 10 according to a first embodiment will be described with reference to FIGS. 1, 3, and 5.

Figure 1:
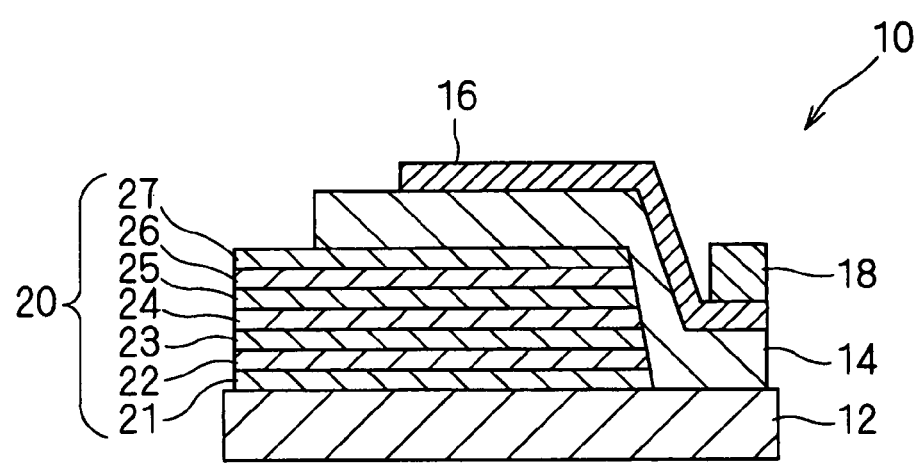
FIG. 1 is a fragmentary cross-sectional view illustrating the structure of a piezoelectric thin-film resonator according to a first embodiment of the present invention.

FIG. 1 is a fragmentary cross-sectional view illustrating the piezoelectric thin-film resonator 10 according to a first embodiment of the present invention. The piezoelectric thin-film resonator 10 includes a lower electrode 20, a piezoelectric thin film 14, an upper electrode 16, and an upper thick electrode 18 that are formed on a substrate 12 in that order.

A LiTaO$_3$ or LiNbO$_3$ single-crystal substrate is used as the substrate 12.

The lower electrode 20 includes an acoustic reflecting layer on the substrate 12. Different conducting materials between which a mismatch in the lattice constants is small are alternately deposited on the substrate 12 by epitaxial growth to form alternately laminated sublayers 21 to 27, the sublayers 21 to 27 constituting the lower electrode 20. The sublayers 21 to 27 are formed by a film-forming method, such as evaporation or sputtering, in a manner such that a sublayer having a relatively high acoustic impedance and a sublayer having a relatively low acoustic impedance are alternately laminated. Patterning is performed by a method, such as a lift-off procedure, dry etching, or wet etching. The sublayers 21 to 27 comprising the lower electrode 20 can be easily formed by epitaxial growth using the substrate 12 composed of a LiTaO$_3$ single crystal or a LiNbO$_3$ single crystal.

Each of the sublayers having a relatively high acoustic impedance and the sublayers having a relatively low acoustic impedance included in the acoustic reflecting layer are preferably composed of a metal having a face-centered cubic structure or an alloy principally containing such a metal. The sublayers having a relatively high acoustic impedance may be composed of an elemental metal selected from (a) Pt, Ir, Pd, Rh, Au, Ni, and Cu; or an alloy principally containing at least one metal selected from (b) Pt, Ir, Pd, Rh, Au, Ni, and Cu. The sublayers having a relatively low acoustic impedance may be composed of an elemental metal selected from (a) Al and Ag; or an alloy principally containing at least one metal selected from (b) Al and Ag.

The acoustic reflecting layer may further include another sublayer, such as an intermediate sublayer for facilitating the formation of an epitaxial film or an adhesive layer for improving adhesion between the sublayers, between the layer having a relatively high acoustic impedance and the layers having a relatively low acoustic impedance. The number of sublayers having a relatively high acoustic impedance may be one or more. The number of the sublayers each having a relatively low acoustic impedance may also be one or more. The number of sublayers having a relatively high acoustic impedance needs not to be identical to the number of sublayers having a relatively low acoustic impedance.

The piezoelectric thin film 14 is provided on the uppermost sublayer 27 in the lower electrode 20. Thereby, the piezoelectric thin film 14 is highly oriented. Furthermore, the piezoelectric thin film 14 is triaxially oriented. The piezoelectric thin film 14 is formed of ZnO, AlN, CdS, lead titanate, lead zirconate titanate or the like by a film-forming method, such as evaporation, sputtering, or chemical vapor deposition (CVD). For example, the piezoelectric thin film 14 is laminated over the entire lower electrode 20, and then an opening for connecting the lower electrode 20 is formed. Examples of a method for forming the opening include wet etching, dry etching, and a lift-off procedure using a sacrificial layer. For example, in wet etching, a strong alkali, such as TMAH, KOH, or NaOH, is used as an etchant. Dry etching using a reaction gas principally containing chlorine ($Cl_2$) may be employed. A mask used is constituted of an elemental metal, such as Ti, Cr, Ni, Au, or Pt, multiple metal layers, an alloy, or a photoresist.

The upper electrode 16 is formed of an electrode material (including an alloy), such as Pt, Ir, Mo, W, Ti, Cr, Co, or Ru by a film-forming method, such as evaporation or sputtering. Furthermore, the upper electrode 16 may be formed of a multilayer film. Patterning is performed by a lift-off procedure, dry etching, or wet etching.

To reduce the resistance of the lead, a metal principally composed of aluminum, gold, or copper is deposited as the upper thick electrode 18 at a portion of the lead other than an oscillating portion where the piezoelectric thin film 14 is held by the upper and lower electrodes 16 and 20, the upper electrode 16 being disposed opposite the lower electrode 20. To prevent oxidation and diffusion, the upper thick electrode 18 may have a multilayer structure composed of Al, Ti, NiCr, Cr, Au, Pt, or the like.

The formation of a film composed of AlN or ZnO, which is a representative compound used for a piezoelectric thin film in a BAW device, on a polycrystalline electrode results in a uniaxially oriented film in which the c-axis, which is the polarization axis, grows in a direction normal to the substrate. The crystallinity along the c-axis of the piezoelectric thin film is strongly influenced by the crystal structure and the surface roughness of the base. Thus, it is required that the mismatch in the lattice constants between the base and the piezoelectric thin film is small and that the surface roughness of the base is small.

When an acoustic reflecting layer composed of a conducting material is used, in order to improve resonance characteristics, it is necessary to acoustically insulate the acoustic reflecting layer from the substrate. Thus, the number of laminated sublayers in the acoustic reflecting layer needs to be increased. When a polycrystalline material is used as the conducting material, the surface roughness of the acoustic reflecting layer increases with increasing the number of laminated sublayers and the total thickness. If a piezoelectric thin film is formed on a film serving as the base and having a large surface roughness, the resulting piezoelectric thin film is a uniaxially oriented film with poor crystallinity, thereby degrading the piezoelectric effect. Furthermore, orientation in the c-plane is random because of the uniaxially oriented film, and many grain boundaries are present. The grain boundaries reduce the binding strength between the grains and scatter a bulk wave, thus increasing loss of propagation.

To overcome these problems, an epitaxially grown acoustic reflecting layer composed of a conducting material and also serving as an electrode is effectively used. In the piezoelectric thin-film resonator 10, the acoustic reflecting layer is formed by epitaxial growth to improve the surface roughness.

A specific example of the piezoelectric thin-film resonator 10 (first embodiment) will be described below.

A process for producing the piezoelectric thin-film resonator 10 according to the first embodiment will now be described.

The lower electrode 20 is formed on the substrate 12 composed of a Z-cut $LiTaO_3$ single crystal. A resist pattern is formed by photolithography. The following sublayers are formed by evaporation: high acoustic impedance sublayers 21, 23, and 25 composed of platinum and each having a high acoustic impedance; low acoustic impedance sublayers 22, 24, and 26 composed of aluminum and each having a low acoustic impedance; and interlayer sublayers composed of titanium for improving the adhesion between adjacent sublayers (not shown). These sublayers are formed in numerical order. Subsequently, the resist is removed by a lift-off procedure to form the lower electrode 20 having a predetermined shape. The thickness of the titanium film is preferably about 1 nm to about 100 nm. With respect to the acoustic impedance sublayers 21 to 26 comprising the acoustic reflecting layer, it is preferable to substantially satisfy the following relationship:

$$t = \lambda/4$$

where t represents a thickness; and $\lambda$ represents a wavelength that satisfies the following relationship:

$$\lambda = v/f$$

where f represents an operating frequency; and v represents the velocity of sound in the material. For example, in a resonator that operates at about 5 GHz, three pairs of a high acoustic impedance sublayer composed of platinum having a thickness of about 160 nm and a low acoustic impedance sublayer composed of aluminum having a thickness of about 290 nm, i.e., three pairs of the sublayers 21 and 22; 23 and 24; and 25 and 26, are laminated, thereby achieving satisfactory characteristics. Furthermore, a platinum sublayer 27 having a thickness of about 80 nm is laminated on the acoustic reflecting layer (acoustic impedance sublayer 26), thereby achieving more satisfactory characteristics. After the platinum sublayer 27 is formed by evaporation subsequent to the formation of the groove 26 by evaporation, the lift-off procedure may be performed.

The piezoelectric thin film 14 composed of aluminum nitride is formed by radio-frequency magnetron sputtering (RF magnetron sputtering). The thickness of the aluminum nitride film is determined in the range of about 10 nm to about 3,000 nm in response to an operating frequency and a necessary bandwidth. For example, in a resonator that operates at about 5 GHz, the aluminum nitride film having a thickness of about 400 nm to about 600 nm exhibits satisfactory characteristics.

To form an opening in the piezoelectric thin film 14, the opening being used for connecting the lower electrode 20, a lift-off procedure with a sacrificial layer composed of zinc oxide is performed. Alternatively, wet etching is performed with an aqueous solution of a strong alkali using a mask composed of a metal or a resin.

To form the upper electrode 16, a resist pattern is formed by photolithography, and a titanium layer, a platinum layer, a titanium layer, and an aluminum layer are deposited in that order by evaporation. Then, the resist is removed by a lift-off procedure to form the upper electrode 16 having a predetermined shape. The thickness of the titanium layer is determined in the range of about 1 nm to about 100 nm, the thickness of the platinum layer is determined in the range of about 1 nm to about 500 nm, and the thickness of the aluminum layer is determined in the range of about 1 nm to about 500 nm, in response to necessary characteristics, such as a frequency, a bandwidth, and a Q-value. For example, in a resonator that operates at about 5 GHs, when the platinum layer having a thickness of about 10 nm to about 100 nm and the aluminum layer having a thickness of about 50 nm to about 100 nm are formed, satisfactory characteristics are exhibited.

Copper and aluminum layers each having a thickness of about 500 nm to about 5,000 nm and serving as the upper thick electrode 18 are deposited. The upper thick electrode 18 has a multilayer structure, such as Al/Ti/Cu/Ti or Pt/Ti/Cu/Ti.

In the resulting piezoelectric thin-film resonator 10 according to the first embodiment, the sublayers 21 to 27 in the lower electrode 20 each have a twin-crystal structure. With respect crystal orientation, the (111) plane grows in the direction parallel to the surface of the substrate 12.

Figures 3, 3A:
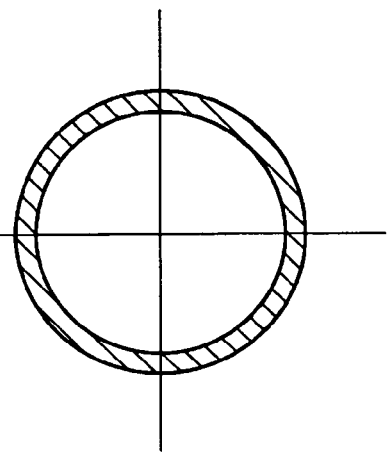

As a comparative embodiment, an aluminum sublayer and a platinum sublayer serving as an acoustic reflecting layer are laminated on a polycrystalline silicon substrate, and a piezoelectric thin film composed of aluminum nitride is formed (see FIG. 3A-1). In this comparative embodiment, the surface roughness Ra of the acoustic reflecting layer is about 2.0 nm. The surface roughness Ra of the aluminum nitride piezoelectric thin film on the acoustic reflecting layer is about 2.1 nm.

In contrast, in the first embodiment in which an aluminum sublayer and a platinum sublayer serving as an acoustic reflecting layer are laminated on a Z-cut LiTaO$_3$ single crystal substrate and an aluminum nitride piezoelectric thin film having a thickness of about 500 nm is formed on the acoustic reflecting layer, the surface roughness Ra of the lower electrode 20 is about 1.3 nm, and the surface roughness Ra of the aluminum nitride piezoelectric thin film is about 1.4 nm. That is, the surface roughness is improved.

Figure 2:
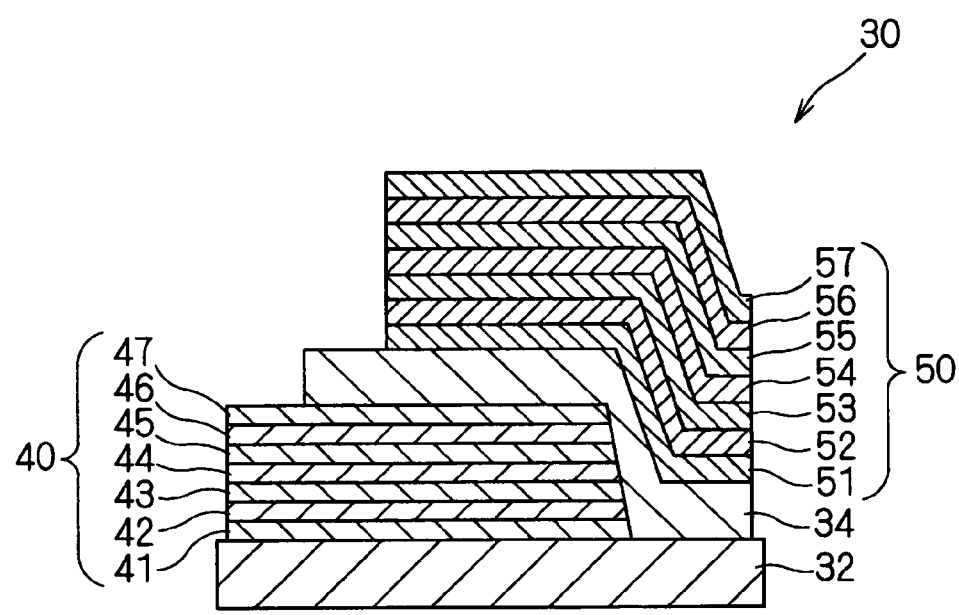
FIG. 2 is a fragmentary cross-sectional view illustrating the structure of a piezoelectric thin-film resonator according to a second embodiment of the present invention.
Figures 3, 3B:
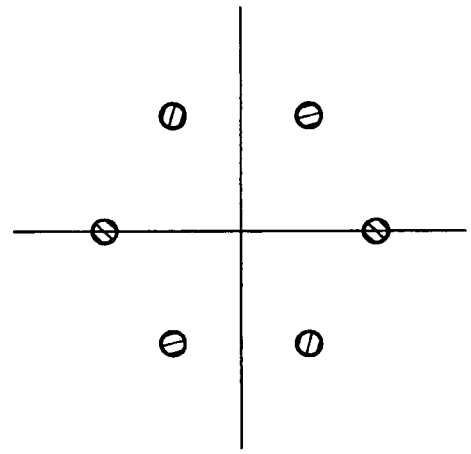
Figures 2, 3A:
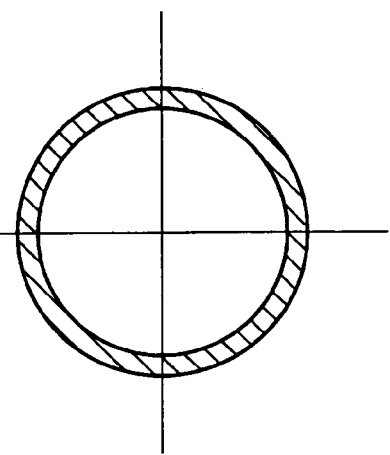
Figures 2, 3B:
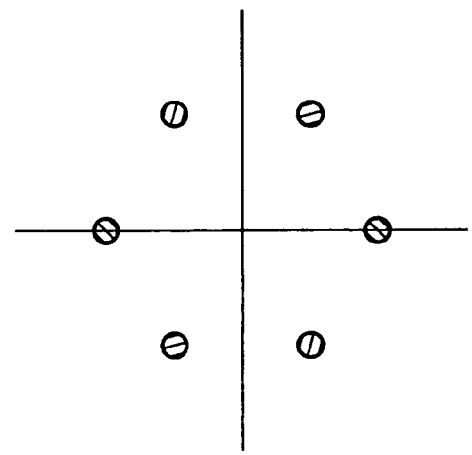
Figures 1, 3A:
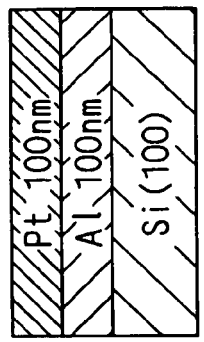
Figures 1, 3B:
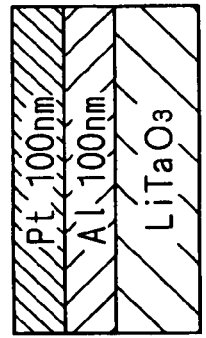

In the first embodiment, the conducting materials between which a mismatch is small are laminated. Thus, the upper sublayer can also be formed by epitaxial growth. In the comparative embodiment in which the aluminum sublayer and the platinum sublayer serving as the acoustic reflecting layer are laminated on the silicon substrate as shown in FIG. 3A-1, FIGS. 3A-2 and 3A-3 show an X-ray diffraction pole of the first aluminum sublayer and the first platinum sublayer, respectively, each of the pole figures showing a substantially ring shape. As is evident from these results, the first aluminum sublayer and the first platinum sublayer are each a uniaxially oriented polycrystalline film. In contrast, in the first embodiment in which the aluminum sublayer and the platinum sublayer serving as the acoustic reflecting layer are laminated on a Z-cut LiTaO$_3$ single crystal substrate as shown in FIG. 3B-1, in the X-ray diffraction pole figures of the first aluminum sublayer and the first platinum sublayer as shown in FIGS. 3B-2 and 3B-3, spots representing six-fold symmetry are measured. This indicates that the first aluminum sublayer and the first platinum sublayer are each an epitaxially grown film having a twin-crystal structure. In each of FIGS. 3A-2, 3A-3, 3B-2, and 3B-3, the diffracting plane of each of the aluminum sublayers and the platinum sublayers in the X-ray diffraction is the corresponding (111) plane.

In the first embodiment, aluminum sublayers and platinum sublayers serving as an acoustic reflecting layer are alternately laminated as shown in FIG. 4A-1. In this way, even when the plurality of sublayers are laminated so as to achieve satisfactory characteristics, the X-ray diffraction pole figures of the upper aluminum sublayer and the upper platinum sublayer of FIGS. 4A-2 and 4A-3, showing clear spots representing six-fold symmetry are also measured. This indicates that the upper sublayer can also be formed by epitaxial growth. In each of FIGS. 4A-2 and 4A-3, the diffracting plane of each of the aluminum sublayers and the platinum sublayers in the X-ray diffraction is the corresponding (111) plane.

Figures 2, 5A:
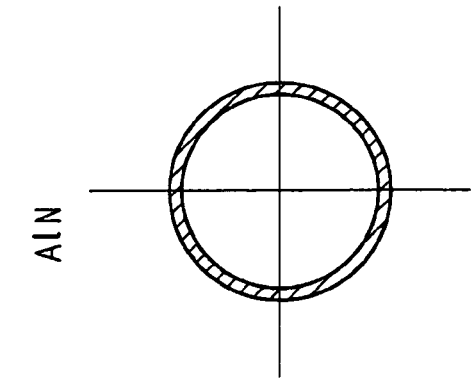
Figures 2, 5B:
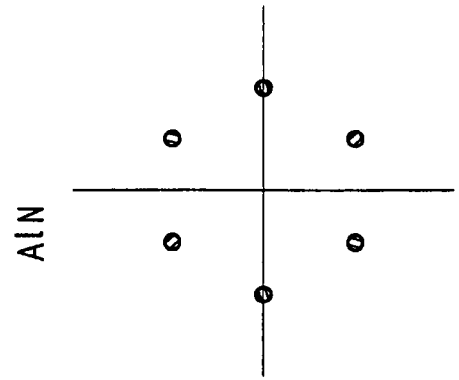
Figures 1, 5A:
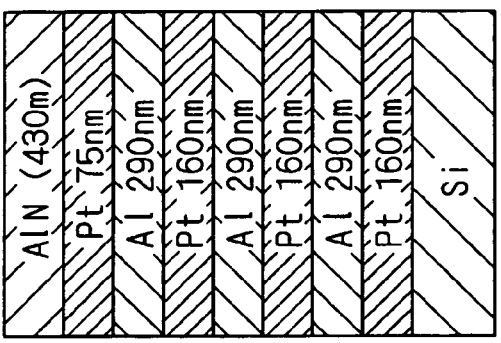
Figures 1, 5B:
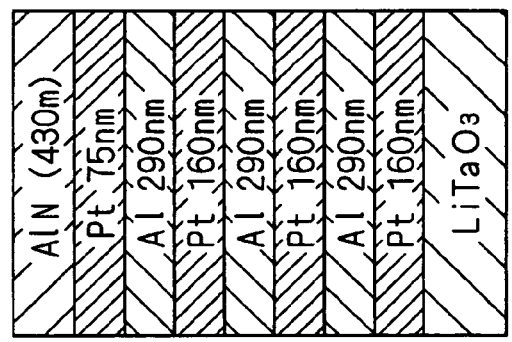

As shown in FIGS. 5A-1 and 5B-1, aluminum nitride piezoelectric thin films are formed on the lower electrodes including a plurality of platinum sublayers and aluminum sublayers. In the comparative embodiment shown in FIG. 5A-1, the pole figure shows a substantially ring shape as schematically shown in FIG. 5A-2. This indicates that the aluminum nitride piezoelectric thin film is uniaxially oriented. In contrast, in the first embodiment shown in FIG. 5B-1, as schematically shown in FIG. 5B-2, spots representing six-fold symmetry are measured. That is, the aluminum nitride piezoelectric thin film is triaxially oriented. Thus, in the first embodiment, the grain boundaries in the piezoelectric thin film are dramatically reduced compared with those in the uniaxially oriented film. In each of FIGS. 5A-2 and 5B-2, the diffracting plane of the aluminum nitride layer in the X-ray diffraction is the (0002) plane, which is the Z plane. In FIG. 5A-2, the full width at half maximum (FWHM) of the rocking curve is about 3.2°. In FIG. 5B-2, the FWHM of the rocking curve is about 2.1°.

In the piezoelectric thin-film resonator 10 according to the first embodiment, when the lower electrode 20 and the piezoelectric thin film 14 are formed on the single-crystal substrate 12, each of the sublayers in the lower electrode 20 and the piezoelectric thin film 14 are formed by epitaxial growth.

Thereby, the following effects are obtained:

(1) When the acoustic reflecting layer, which also serves as a lower electrode, having the number of sublayers required for achieving sufficient acoustic insulation from the substrate is formed, the sublayers are epitaxial films. Thus, the surface roughness is significantly improved compared with that of a polycrystalline film. By forming the piezoelectric thin film on the resulting epitaxial film having improved surface roughness, the crystallinity of the piezoelectric thin film can be significantly improved. Furthermore, a triaxially oriented piezoelectric thin film can be realized. As a result, it is possible to improve piezoelectric characteristics, reduce elastic scattering due to lattice defects, and improving the Q-value;

(2) the use of the epitaxially grown acoustic reflecting layer reduces the number of grain boundaries to reduce elastic scattering in the acoustic reflecting layer, thereby reducing loss of propagation to improve the Q-value;

(3) the use of the epitaxially grown acoustic reflecting layer can achieve the uniformity of the quality (density and Young's modulus) of the sublayers in the acoustic reflecting layer even when a plurality of sublayers are laminated. Therefore, variations in properties and a variation in frequency are reduced in the in-plane direction of the wafer and in a batch. Thus, the design is facilitated;

(4) the use of the epitaxially grown acoustic reflecting layer can prevent the occurrence of failures, such as hillocks and voids, due to the self-diffusion in the grain boundaries;

(5) the epitaxially grown piezoelectric thin film functions as the oscillating portion, thereby improving piezoelectric characteristics, reducing loss of propagation due to grain boundary scattering, and significantly improving resonance characteristics, compared with the case in which a known uniaxially oriented film is used. Furthermore, electronic devices, such as filters and duplexers, produced by combining the resonators according to the present invention also have significantly improved characteristics; and (6) the epitaxial acoustic reflecting layer can be formed by electron beam deposition and a lift-off procedure, thus easily patterning the acoustic reflecting layer.

The piezoelectric thin-film resonator 10 according to the first embodiment has the following different points from the above-described Japanese Unexamined Patent Application Publication No. 2002-278558 and Japanese Unexamined Patent Application Publication No. 2003-258594:

(1) The piezoelectric thin-film resonator 10 includes a plurality of epitaxially grown sublayers that are alternately laminated on the substrate 12;

(2) the piezoelectric thin-film resonator 10 includes the sublayers composed of conducting materials in the acoustic reflecting layer, the sublayers being formed by epitaxial growth. In the resulting epitaxial films, the number of grain boundaries is extremely small compared with that in a polycrystalline film, thus reducing resistivity. There is no occurrence of elastic scattering at the grain boundaries. Furthermore, there is no occurrence of grain boundary diffusion due to a stress. Hence, the resulting epitaxial films are excellent;

(3) the piezoelectric thin film 14 in the piezoelectric thin-film resonator 10 can be epitaxially grown on the epitaxially grown acoustic reflecting layer composed of conducting materials, thereby improving piezoelectric characteristics, reducing loss of propagation, and improving power durability; and (4) the acoustic reflecting layer composed of conducting materials can be patterned by a combination of evaporation and a lift-off procedure. When sputtering is employed, a high-cost process such as dry etching is required after the film formation. However, the combination of evaporation and the lift-off procedure advantageously eliminates the need for such a high-cost process.

A piezoelectric thin-film resonator 30 according to a second embodiment will be described below with reference to FIG. 2.

FIG. 2 is a fragmentary cross-sectional view illustrating the structure of the piezoelectric thin-film resonator 30. The piezoelectric thin-film resonator 30 has the same structure as that of the piezoelectric thin-film resonator 10 according to the first embodiment except that an upper electrode 50 includes an acoustic reflecting layer.

The piezoelectric thin-film resonator 30 according to the second embodiment includes a lower electrode 40, a piezoelectric thin film 34, and an upper electrode 50, provided in that order, on a substrate 32.

The substrate 32 is composed of a $LiTaO_3$ or $LiNbO_3$ single crystal. The lower electrode 40 includes acoustic reflecting layer. The lower electrode 40 includes a plurality of sublayers 41 to 47 and formed by a film-forming method, such as evaporation or sputtering in a manner such that a high acoustic impedance sublayer and a low acoustic impedance sublayer are alternately laminated. Examples of a patterning process used include a lift-off procedure, dry etching, and wet etching.

The piezoelectric thin film 34 composed of ZnO, AlN, CdS, lead titanate, lead zirconate titanate or the like is formed by a film-forming method, such as evaporation, sputtering, or CVD. For example, the piezoelectric thin film 34 is laminated over the entire lower electrode 40, and then an opening for connecting the lower electrode 40 is formed. Examples of a method for forming the opening include wet etching, dry etching, and a lift-off procedure using a sacrificial layer. In wet etching, a strong alkali, such as TMAH, KOH, or NaOH, is used as an etchant. Dry etching using a reaction gas principally containing chlorine ($Cl_2$) may be employed. A mask used is composed of an elemental metal, such as Ti, Cr, Ni, Au, or Pt, an alloy, or a photoresist. The mask may have a multilayer structure composed of a metal.

The upper electrode 50 is formed by the same method as that employed for forming the lower electrode 40.

To reduce the resistance of the lead, a metal principally composed of aluminum, gold, copper, or the like is deposited as an upper thick electrode (not shown) at a portion of the lead other than an oscillating portion that is disposed between the upper electrode 50 and the lower electrode 40. To prevent oxidation and diffusion, the upper thick electrode preferably has a multilayer structure composed of Al, Ti, NiCr, Cr, Au, Pt, or the like.

A process for producing the piezoelectric thin-film resonator 30 according to the second embodiment will be described below.

The lower electrode 40 is formed on a Z-cut $LiTaO_3$ single crystal substrate 32. A resist pattern is formed by photolithography. The following sublayers are formed by evaporation: a high acoustic impedance sublayer composed of platinum; a low acoustic impedance sublayer composed of aluminum; and an interlayer sublayer composed of titanium for improving the adhesion between adjacent sublayers, formed in that order. Subsequently, the resist is removed by a lift-off procedure to form the lower electrode 40 having a predetermined shape. The thickness of the titanium film is preferably about 1 nm to about 100 nm. With respect to the high and low acoustic impedance sublayers constituting the acoustic reflecting layer, the thickness of each sublayer is determined so as to substantially satisfy the following relationship:

$$t=\lambda/4$$

where t represents a thickness; and $\lambda$ represents a wavelength that satisfies the following relationship:

$$\lambda=v/f$$

where f represents an operating frequency; and v represents the velocity of sound in the material. For example, in a resonator that operates at about 5 GHz, three pairs of a high acoustic impedance sublayer composed of platinum having a thickness of about 160 nm and a low acoustic impedance sublayer composed of aluminum having a thickness of about 290 nm, i.e., three pairs of the sublayers 41 and 42; 43 and 44; and 45 and 46, are laminated, thereby achieving satisfactory characteristics. Furthermore, a platinum sublayer 47 having a thickness of about 30 nm to about 100 nm is laminated on the acoustic reflecting layer 46, thereby achieving more satisfactory characteristics.

The piezoelectric thin film 34 composed of aluminum nitride is formed on the lower electrode 40 by RF magnetron sputtering. The thickness of the aluminum nitride film is determined in the range of about 10 nm to about 3,000 nm in response to an operating frequency and a necessary bandwidth. For example, in a resonator that operates at about 5 GHz, the aluminum nitride film having a thickness of about 400 nm to about 600 nm exhibits satisfactory characteristics.

An opening is formed in the piezoelectric thin film 34. A lift-off procedure with a sacrificial layer composed of zinc oxide is performed. Alternatively, wet etching is performed with an aqueous solution of a strong alkali using a mask composed of a metal or a resin.

The upper electrode 50 is formed on the piezoelectric thin film 34 in the same way as for the lower electrode 40. For example, in a resonator that operates at about 5 GHz, at first, a platinum sublayer 51 having a thickness of about 30 nm to about 100 nm is formed three pairs of a high acoustic impedance sublayer composed of platinum having a thickness of about 160 nm and a low acoustic impedance sublayer composed of aluminum having a thickness of about 290 nm, i.e., three pairs of the sublayers 57 and 56; 55 and 54; and 53 and 52, are laminated, thereby achieving satisfactory characteristics. Providing the platinum sublayer 51 between the piezoelectric thin film 34 and the acoustic impedance sublayer 52 easily achieves satisfactory characteristics.

The piezoelectric thin-film resonator 30 includes the acoustic reflecting layer at the upper portion. Thus, the following effects are obtained in addition to the same effects as those in the piezoelectric thin-film resonator 10 according to the first embodiment:

(1) Connections to the electrodes can be performed from directly above the oscillating portion without influence on the operation of the oscillator, thereby eliminating adversely effects caused by resistance and parasitic inductance due to the length of the lead; and (2) the upper and lower electrodes are thick, thus eliminating the need for separately providing a layer for reducing lead resistance. Therefore, the process for producing the device can be simplified.

As has been described above, in each of the piezoelectric thin-film resonators 10 and 30, the acoustic reflecting layer and the piezoelectric thin film are formed by epitaxial growth, thereby reducing loss of energy in the acoustic reflecting layer to improve the Q-value of the piezoelectric thin-film resonator.

The present invention is not limited to the above-described embodiments. Various modifications may be available.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric thin-film resonator comprising:
    a first excitation electrode and a second excitation electrode, the first excitation electrode being disposed opposite the second excitation electrode;
    a piezoelectric thin film disposed between the first excitation electrode and the second excitation electrode; and
    a substrate supporting the first excitation electrode, the substrate comprising a LiTaO₃ single crystal or a LiNbO₃ single crystal, the first excitation electrode including an acoustic reflecting layer, the acoustic reflecting layer comprising:
        (a) at least one epitaxially grown first sublayer comprising a first conducting material having a first acoustic impedance; and
        (b) at least one epitaxially grown second sublayer comprising a second conducting material having a second acoustic impedance, the first acoustic impedance being higher than the second acoustic impedance.

2. The piezoelectric thin-film resonator according to claim 1, wherein each of the at least one first sublayer and the at least one second sublayer of the acoustic reflecting layer are epitaxial sublayers having a twin-crystal structure.

3. The piezoelectric thin-film resonator according to claim 1, wherein each of the at least one first sublayer and the at least one second sublayer of the acoustic reflecting layer comprises a metal having a face-centered cubic structure or an alloy principally containing a metal having a face-centered cubic structure.

4. The piezoelectric thin-film resonator according to claim 1, wherein the at least one first sublayer of the acoustic reflecting layer comprises one of:
    (a) an elemental metal selected from Pt. Ir, Pd, Rh, Au, Ni, and Cu, and
    (b) an alloy principally containing at least one metal selected from Pt, Ir, Pd, Rh, Au, Ni, and Cu; and
    the second at least one sublayer of the acoustic reflecting layer comprises one of:
    (a) an elemental metal selected from Al and Ag; and
    (b) an alloy principally containing at least one metal selected from Al and Ag.

5. The piezoelectric thin-film resonator according to claim 1, wherein the at least one first sublayer comprises one of:
    (a) elemental Pt; and
    (b) a Pt alloy, and
    the at least one second sublayer in the acoustic reflecting layer comprises one of:
    (a) elemental Al; and
    (b) an Al alloy,
    the acoustic reflecting layer including at least one intermediate sublayer comprising titanium, the intermediate sublayer being disposed between each of the at least one first sublayer and the at least one second sublayer, each first sublayer being adjacent to a corresponding second sublayer.

6. The piezoelectric thin-film resonator according to claim 1, wherein the piezoelectric thin film is an epitaxial film.

7. The piezoelectric thin-film resonator according to claim 1, wherein the substrate comprises one of:
    (a) a Z-cut LiTaO₃ single crystal; and
    (b) a Z-cut LiNbO₃ single crystal.

8. The piezoelectric thin-film resonator according to claim 1, wherein the piezoelectric thin film comprises ZnO or AlN.

9. A process for producing a piezoelectric thin-film resonator, the process comprising:
    forming a first excitation electrode on a substrate, the substrate comprising a LiTaO₃ single crystal or a LiNbO₃ single crystal;
    forming a piezoelectric thin film on the first excitation electrode; and
    forming a second excitation electrode on the piezoelectric thin film,
    wherein the forming of the first excitation electrode further includes:
    forming an acoustic reflecting layer by alternately forming:
        (a) at least one first sublayer comprising a first conducting material having a first acoustic impedance; and
        (b) at least one second sublayer comprising a second conducting material having a second acoustic impedance, the first acoustic impedance being higher than the second acoustic impedance, the at least one first sublayer and the at least one second sublayer being formed on the substrate by epitaxially growth, and each of the at least one first sublayer and the at least one second sublayer functioning as at least part of the first excitation electrode.

10. The process for producing the piezoelectric thin-film resonator according to claim 9, wherein the step of forming the acoustic reflecting layer further includes the subsubsteps of:

(a) forming a resist pattern on the substrate by photolithography;

(b) alternately depositing the at least one first sublayer and the at least one second sublayer by evaporation; and (c) removing the at least one first sublayer and the at least one second sublayer on the resist pattern together with the resist pattern.

* * * * *